United States Patent
Daicho et al.

(10) Patent No.: US 8,669,699 B2
(45) Date of Patent: Mar. 11, 2014

(54) PLANAR LIGHT-EMITTING MODULE

(75) Inventors: Hisayoshi Daicho, Shizuoka (JP); Kazuhiro Ito, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/530,230

(22) Filed: Jun. 22, 2012

(65) Prior Publication Data

US 2013/0002128 A1 Jan. 3, 2013

(30) Foreign Application Priority Data

Jun. 28, 2011 (JP) .................... 2011-143266

(51) Int. Cl.
*H05B 33/22* (2006.01)

(52) U.S. Cl.
USPC ............................. 313/502; 313/498

(58) Field of Classification Search
USPC ............ 313/498–512; 315/169.3; 345/36, 45, 345/76
See application file for complete search history.

(56) References Cited

U.S. PATENT DOCUMENTS

| | | | | |
|---|---|---|---|---|
| 6,066,861 A * | 5/2000 | Hohn et al. | ...................... | 257/99 |
| 6,809,347 B2 * | 10/2004 | Tasch et al. | .................... | 257/103 |
| 7,629,620 B2 * | 12/2009 | Maeda et al. | .................... | 257/98 |
| 2005/0057145 A1 * | 3/2005 | Shieh et al. | ..................... | 313/503 |
| 2011/0273079 A1 * | 11/2011 | Pickard et al. | ................. | 313/483 |

FOREIGN PATENT DOCUMENTS

| | | |
|---|---|---|
| JP | 2007-243055 A | 9/2007 |
| JP | 2007287448 A | 11/2007 |
| JP | 2011181793 A | 9/2011 |
| JP | 2011243356 A | 12/2011 |

OTHER PUBLICATIONS

Office Action issued by the Korean Intellectual Property Office dated May 30, 2013 in corresponding Application No. 10-2012-0067852.

* cited by examiner

*Primary Examiner* — Nimeshkumar Patel
*Assistant Examiner* — Christopher Raabe
(74) *Attorney, Agent, or Firm* — Sughrue Mion, PLLC

(57) ABSTRACT

A planar light-emitting module includes a planar substrate applied with a reflection film, a light-emitting element mounted on the reflection film side of the substrate, a first transparent resin layer disposed to encapsulate at least the light-emitting element, and a second transparent resin layer disposed to sandwich an air layer between the second transparent resin layer and the first transparent resin layer. A phosphor for converting the wavelength of light radiated from the light-emitting element is disposed by dispersion in the first and second transparent resin layers and the phosphor is selected such that when the second transparent resin layer is viewed from the outside, pseudo-white light is observed.

9 Claims, 4 Drawing Sheets

PLANAR LIGHT-EMITTING MODULE

CROSS-REFERENCE TO RELATED APPLICATION(S)

The present application claims the benefit of priority of Japanese Patent Application No. 2011-143266, filed on Jun. 28, 2011, which is incorporated herein by reference.

BACKGROUND

The present disclosure relates to a thin planar light-emitting module.

Conventionally, many fluorescent lamps or bulbs have been used as a lighting tool for illumination. In recent years, to reduce power consumption and extend service life, various white light-emitting devices using a light-emitting diode have been developed as substitutes for such a lighting tool.

The light emitted from a light-emitting diode has strong directivity and a small emission area. Thus, it is difficult to illuminate a wide range with uniform luminance using a single light-emitting diode. Therefore, a lighting tool fabricated by arranging a plurality of light-emitting diodes may be considered. But a large luminance unevenness is produced between the area right above the light-emitting diode and the area above a peripheral part. In order to reduce the illuminance unevenness, a diffusing lens or a diffusing sheet is provided above the light-emitting face of the light-emitting diode. However, such a diffusing lens or a diffusing sheet disadvantageously reduces the light quantity and increases the cost of the lighting tool.

In this connection, JP-A-2007-287448 (JP '448) discloses a lighting device having a lens for guiding light from a light source, wherein an air layer for increasing the angle created by the light emitted from the light source and the main light beam axis of the light source is disposed between the entrance face of the lens and the outside surface as the light-emitting face. Because the air layer can cause light emitted from the light source to reach a wide region, uniform luminescence can be achieved on the light-emitting face.

In the technique described in JP '448, light emitted from the light source is merely transmitted through a lens and therefore, although illuminance unevenness on the light-emitting face may be improved, elimination of color unevenness is not attained.

SUMMARY

One or more exemplary embodiments of the present invention provide a planar light-emitting module using a light-emitting element such as light-emitting diode, which can reduce color unevenness and illuminance unevenness on the light-emitting face and can be realize pseudo-white light illumination.

A planar light-emitting module according to an exemplary embodiment comprises:

a planar substrate applied with a reflection film;

a light-emitting element mounted on the reflection film side of the substrate;

a first transparent resin layer disposed to encapsulate at least the light-emitting element; and a second transparent resin layer, an air layer sandwiched between the second transparent resin layer and the first transparent resin layer, wherein a phosphor for converting the wavelength of light radiated from the light-emitting element is disposed by dispersion in the first and second transparent resin layers and the phosphor is selected such that when the second transparent resin layer is viewed from the outside, pseudo-white light is observed.

According to this embodiment, an air layer is allowed to intervene between first and second transparent resin layers, so that light emitted from a light-emitting element can be diffused in a wide range and a planar light-emitting module reduced in illuminance unevenness can be realized. Also, two transparent resin layers each having dispersed therein a phosphor are provided, so that pseudo-white light illumination with little color unevenness can be achieved.

The thicknesses of the first and second transparent resin layers, the thickness of an air layer disposed between the first transparent resin layer and the second transparent layer, and the concentration of the phosphor may be set such that when the second transparent resin layer is viewed from the outside, pseudo-white light with substantially uniform luminance is observed.

The light-emitting element may radiate ultraviolet light or short-wavelength visible light, and the phosphor may include a first phosphor for converting light radiated from the light-emitting element into yellow light and a second phosphor for converting light radiated from the light-emitting element into blue light.

The planar light-emitting module may further comprise a cover transparent or semi-transparent to visible light. The second transparent resin layer may be provided on the substrate-side surface of the cover.

According to the present invention, in a thin planar light-emitting module using a light-emitting element such as light-emitting diode, color unevenness and illuminance unevenness on the light-emitting face can be reduced and pseudo-white light illumination can be realized.

BRIEF DESCRIPTION OF THE DRAWINGS

The above and other aspects of the present invention will become more apparent from the following description of exemplary embodiments, taken in conjunction with the accompanying drawings of which.

DETAILED DESCRIPTION

Figure 1:
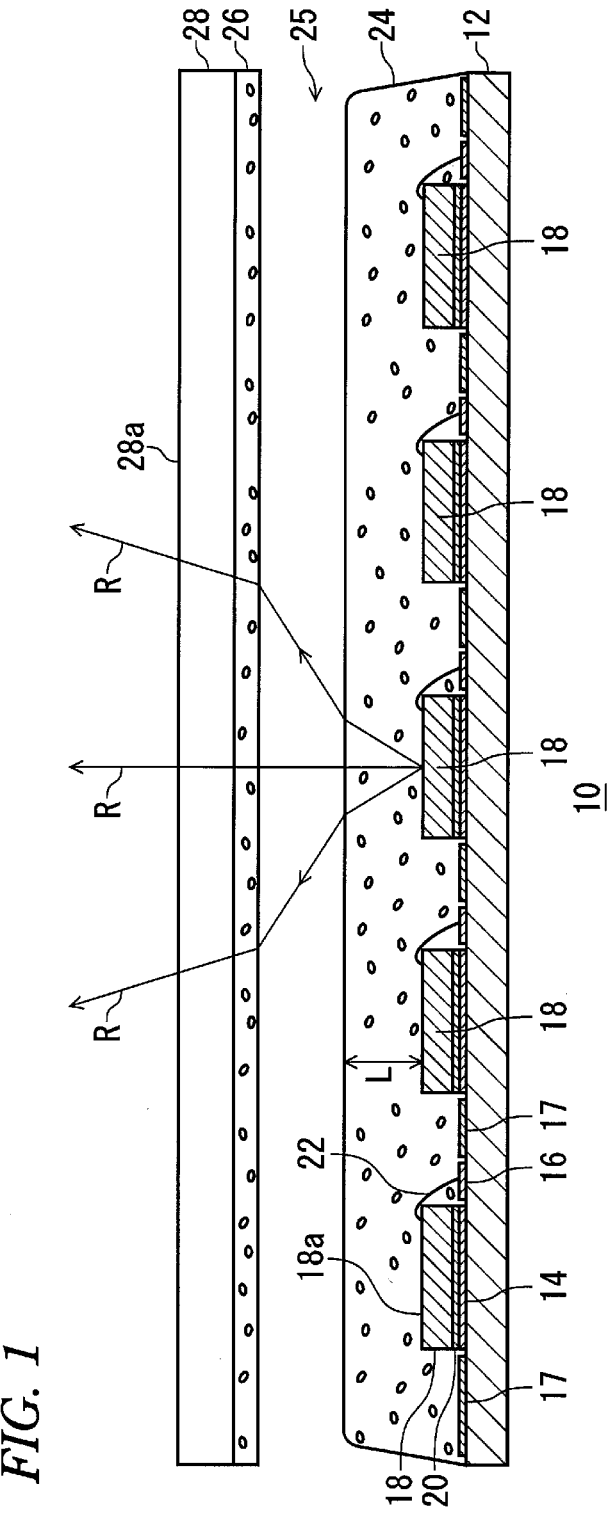
FIG. 1 is a schematic cross-sectional view of a planar light-emitting module according to one embodiment of the present invention.

Hereinafter, exemplary embodiments of the present invention will now be described more fully with reference to the accompanying drawings. The present inventive concept may, however, be embodied in many different forms and should not be construed as being limited to the exemplary embodiments set forth herein. Rather, these exemplary embodiments are provided so that this disclosure will be thorough and complete and will fully convey the concept of the invention to those of ordinary skill in the art. In the following description, well-known functions or constructions are not described in detail if it is determined that as they would obscure the disclosure due to explanation of the exemplary embodiments in unnecessary detail. The same reference numerals represent the same elements throughout the drawings.

FIG. 1 is a schematic cross-sectional view of the planar light-emitting module 10 according to one exemplary embodiment of the present invention. In the planar light-emitting module 10, a plurality of pairs of an electrode 14 (anode in this embodiment) and an electrode 16 (cathode in this embodiment) are formed on a substrate 12. A light-emitting element 18 is fixed on each electrode 14 by a mount member 20. The light-emitting element 18 and the electrode 14 are electrically conducted through the mount member 20, and the light-emitting element 18 and the electrode 16 are electrically conducted through a wire 22.

On the substrate 12, a first transparent resin layer 24 integrally covering a plurality of light-emitting elements 18 is provided. The first transparent resin layer 24 is formed such that the thickness L of the first transparent resin layer 24 in the perpendicular direction along the light exit face 18a of the light-emitting element 18 is uniform. In the first transparent resin layer 24, two kinds of phosphors capable of emitting light of colors in a complementary relationship with respect to each other upon excitation by light emitted from the light-emitting element 18 are dispersed.

Figure 2A:
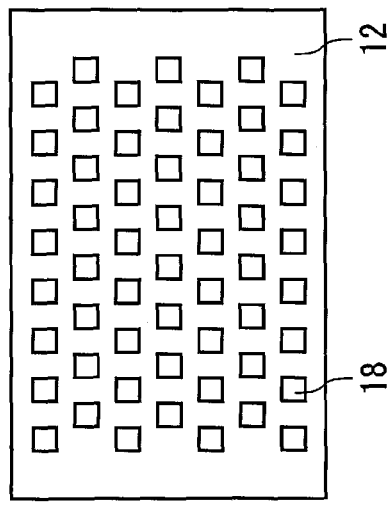
FIGS. 2A and 2B are views of an arrangement of light-emitting element on a substrate.
Figure 2B:
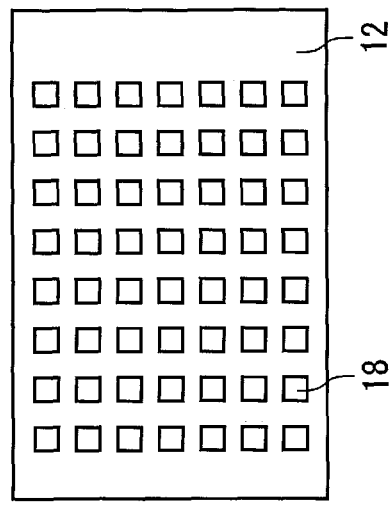

The plurality of light-emitting elements 18 may be arrayed in a grid manner on the substrate 12 as shown in FIG. 2A or may be arrayed in a staggered manner on the substrate 12 as shown in FIG. 2B. The distance between light-emitting elements 18 is, for example, from 2 to 15 mm.

Returning to FIG. 1, on the substrate 12, a reflection film 17 is formed in the region where the electrodes 14 and 16 and the light-emitting element 18 are not provided. The method for forming the reflection film 17 includes the following. An electrode portion is formed on the substrate 12, then an acrylic, urethane-based, silicone-based, fluorine-based or acryl/silicone-based white reflection coating is applied thereon in a state of a mask being put on the electrode portion, and after removing the mask, the light-emitting element 18 is mounted. Due to this configuration, even when light emitted from a phosphor excited by light emitted upward from the light-emitting element 18 is directed toward the substrate 12, the light is again reflected upward by the reflection film 17. As a result, the light components generated from the phosphor that are directed to the substrate 12 side can also be utilized for illumination and in turn, the light extraction efficiency can be enhanced. Incidentally, the reflection film 17 may be a metal film such as aluminum and silver, or the reflection film 17 may be formed by vapor deposition, sputtering, plating or other like method.

The substrate 12 is preferably formed of a material not having electrical conductivity but having high thermal conductivity, and, for example, a ceramic substrate (aluminum nitride substrate, alumina substrate, mullite substrate or glass ceramic substrate), or a glass epoxy substrate may be used. In this connection, when an insulating layer is formed below the electrodes 14 and 16, for example, a metal substrate (preferably a material having high thermal conductivity, such as aluminum, copper and brass), an SiC substrate, a carbon substrate, or a composite substrate of metal and carbon, can be used.

The electrode 14 and the electrode 16 are an electrically conductive layer formed of a metal material such as gold and copper.

As the light-emitting element 18, for example, a light-emitting diode (LED) or laser diode (LD) capable of emitting an ultraviolet ray or short-wavelength visible light can be used. Specific examples thereof include an InGaN-based compound semiconductor. The emission wavelength region of the InGaN-based compound semiconductor varies according to the In content. The emission wavelength tends to become a long wavelength when the In content is large, and become a short wavelength when the content is small, but it has been confirmed that an InGaN-based compound semiconductor containing In to such an extent as giving a peak wavelength near 400 nm exhibits a highest quantum efficiency of light emission. The light-emitting element 18 according to this embodiment is suitably a light-emitting element capable of emitting an ultraviolet ray or short-wavelength visible light having a peak wavelength in the wavelength region of 380 to 420 nm.

The mount member 20 is, for example, an electrically conductive adhesive such as silver paste or a gold-tin eutectic solder and has a role of fixing the bottom of the light-emitting element 18 to the electrode 14 and electrically connecting the bottom-side electrode of the light-emitting element 18 and the electrode 14 on the substrate 12.

The wire 22 is an electrically conductive member such as gold wire and is joined to the top-side electrode of the light-emitting element 18 and the electrode 16, for example, by ultrasonic thermocompression bonding and caused to electrically connect both electrodes.

The first transparent resin layer 24 integrally encapsulates the top of the substrate 12 including a plurality of light-emitting elements 18, with a binder member having dispersed therein respective phosphors described later.

The first transparent resin layer 24 is formed, for example, by mixing a phosphor with a liquid or gel-like binder member to produce a phosphor paste, coating the phosphor paste in sheet form on the top of the substrate 12, and thereafter curing the binder member of the phosphor paste. Examples of the binder member which can be used include a silicone resin, an epoxy resin, a fluororesin, a sol-gel silica, an acrylic resin, a vinyl ester resin, a polyester resin, a norbornene resin, and a vinyl chloride resin. The planar light-emitting module of this embodiment uses an ultraviolet ray or short-wavelength visible light as the excitation light source and therefore, it is most preferred to use a silicone resin excellent in the light resistance.

In the region of the first transparent resin layer 24 on the side opposite the substrate 12, a resin-made or glass-made plate-like cover 28 that is transparent or semi-transparent to visible light is disposed. On the substrate 12-side surface of the plate-like cover 28, a second transparent resin layer 26 is formed by coating. An air layer 25 is sandwiched between the first transparent resin layer 24 and the second transparent layer 26. The thickness of the air layer is selected, for example, between 1 mm and 5 mm.

In the second transparent resin layer 26, as in the first transparent resin layer 24, two kinds of phosphors capable of emitting light of colors in complementary relationship to each other upon excitation by light emitted from the light-emitting element 18 are dispersed. However, the second transparent resin layer 26 is a very thin film compared with the first transparent resin layer 24 and the thickness of the second transparent resin layer is exaggerated in FIG. 1.

Figure 3:
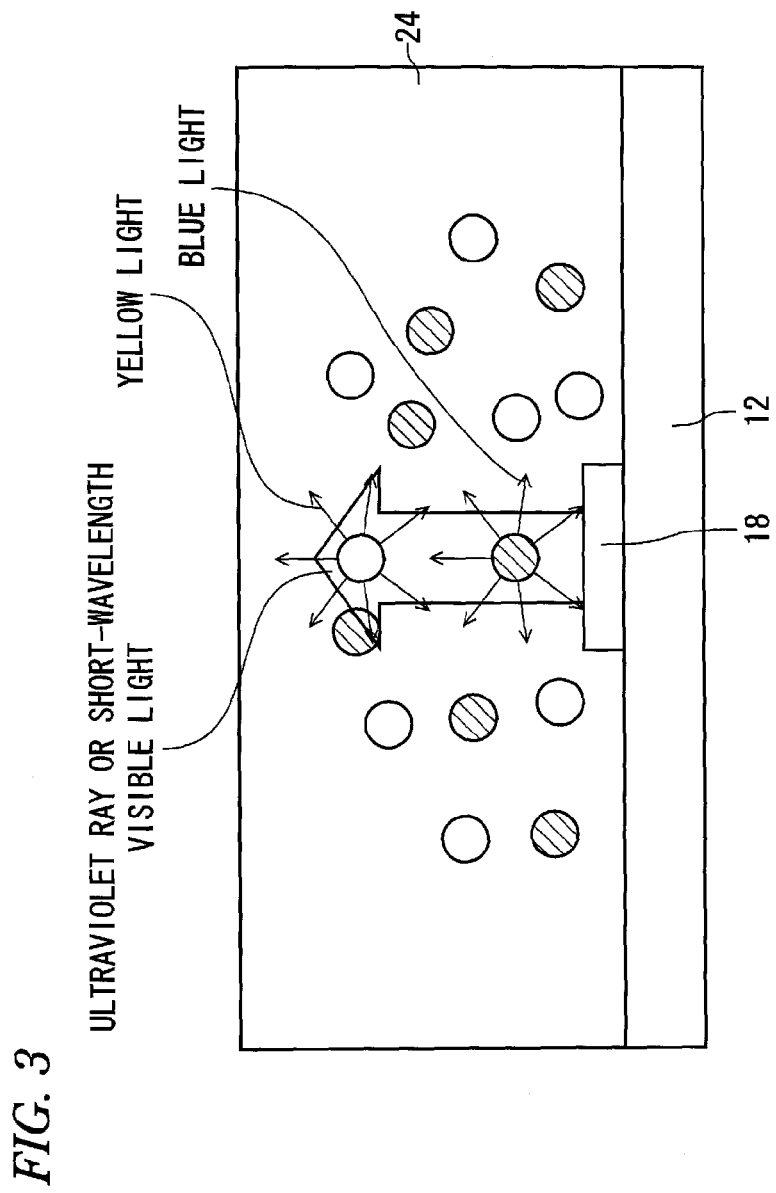
FIG. 3 is a view schematically illustrating a luminescence model of the planar light-emitting module 10 according to this embodiment.

FIG. 3 is a view schematically illustrating a luminescence model of the planar light-emitting module 10 according to this embodiment. In this embodiment, the later-described materials are selected such that a first phosphor radiates yellow light upon excitation by an ultraviolet ray or short-wavelength visible light emitted from the light-emitting element 18 and a second phosphor radiates blue light upon excitation by the ultraviolet ray or short-wavelength visible light.

As shown in FIG. 3, the ultraviolet ray or short-wavelength visible light output from the light-emitting element 18 is mostly absorbed by a first phosphor or a second phosphor dispersed in the first transparent resin layer 24, and each phosphor undergoes a Lambertian light emission. Accordingly, the effect of diffusing highly directive light emitted from the light-emitting element is high. Furthermore, since the first phosphor absorbs almost no blue light, the emission color is scarcely changed even when the thickness of the resin layer containing the phosphor is fluctuated. As a result, variation in the chromaticity distribution of emission color is suppressed.

When an air layer 25 is provided between the first transparent resin layer 24 and the second transparent resin layer 26, light radiated from the light-emitting element 18 can be diffused to the periphery as shown by the arrows R in FIG. 1. Accordingly, even without using a diffusing lens or a diffusing sheet, light spreads also to a portion between a light-emitting element and a light-emitting element, and uniformity of illuminance on the light-emitting face 28a can be elevated. The thickness of the air layer 25 may be determined by taking into consideration to what extent of range the light emitted from each light-emitting element should be diffused, based on the density of light-emitting elements 18 on the substrate 12.

Also in the second transparent resin layer 26, the same effect as in the first transparent resin layer 24 occurs. That is, the ultraviolet ray or short-wavelength visible light not absorbed by the phosphor in the first transparent resin layer 24 is converted into yellow light or blue light by the action of the phosphor in the second transparent resin layer 26. In this way, yellow light or blue light is radiated also by the phosphor in the second transparent resin layer 26 close to the light-emitting face 28a, so that variation in the chromaticity, that is, color unevenness, on the light-emitting face 28a can be reduced even more.

In this embodiment, the thicknesses of the first transparent resin layer 24 and the second transparent resin layer 26, the thickness of the air layer 25, and the concentration of the phosphor are adjusted so that pseudo-white light with substantially uniform illuminance can be observed when viewed from the outside of the second transparent layer 26, that is, from the light-emitting face 28a. In one example, the thickness of the first transparent resin layer 24 is adjusted to be from 1 to 5 mm, the thickness of the second transparent resin layer 26 is adjusted to be from 40 to 200 μm, and the concentration is adjusted to be from 0.5 to 10.0 vol % for both phosphors.

Respective phosphors used for the planar light-emitting module of this embodiment are described in detail below.

[First Phosphor]

The first phosphor is a phosphor capable of being excited by ultraviolet or short-wavelength visible light and emitting visible light and is a phosphor represented by the formula: $(M^2_x, M^3_y, M^4_z)_m M^1 O_3 X_{(2/n)}$ (wherein $M^1$ represents one or more elements containing at least Si and being selected from the group consisting of Si, Ge, Ti, Zr and Sn, $M^2$ represents one or more elements containing at least Ca and being selected from the group consisting of Ca, Mg, Ba and Zn, $M^3$ represents one or more elements containing at least Sr and being selected from the group consisting of Sr, Mg, Ba and Zn, X represents at least one halogen element, $M^4$ represents one or more elements containing at least $Eu^{2+}$ and being selected from the group consisting of a rare earth element and Mn, m may be in a range of $1 \leq m \leq 4/3$, n may be in a range of $5 \leq n \leq 7$, and x, y and z may be in ranges satisfying x+y+z=1, $0 \leq x \leq 0.99$, $0 \leq y \leq 0.99$, and $0.01 \leq z \leq 0.3$). Also, the first phosphor is a phosphor that emits visible light having a peak wavelength in the wavelength region of 560 to 600 nm.

The first phosphor can be obtained, for example, as follows. For the first phosphor, compounds represented by the following compositional formulae (1) to (4) can be used as raw materials:

(1) $M'^1 O_2$ ($M'^1$ represents a tetravalent element such as Si, Ge, Ti, Zr and Sn), (2) $M'^2 O$ ($M'^2$ represents a divalent element such as Mg, Ca, Ba and Zn), (3) $M'^3 X_2$ ($M'^3$ represents a divalent element such as Mg, Sr, Ba and Zn, and X represents a halogen element), and (4) M'4 ($M'^4$ represents a rare earth element such as $Eu^{2+}$ and/or Mn).

As the raw material of compositional formula (1), for example, $SiO_2$, $GeO_2$, $TiO_2$, $ZrO_2$ or $SnO_2$ can be used. As the raw material of compositional formula (2), for example, a carbonate, oxide or hydroxide of a divalent metal ion can be used. As the raw material of compositional formula (3), for example, $SrCl_2$, $SrCl_2.6H_2O$, $MgCl_2$, $MgCl_2.6H_2O$, $BaCl_2$, $BaCl_2.2H_2O$, $ZnCl_2$, $MgF_2$, $SrF_2$, $BaF_2$, $ZnF_2$, $MgBr_2$, $SrBr_2$, $BaBr_2$, $ZnBr_2$, $MgI_2$, $SrI_2$, $BaI_2$ or $ZnI_2$ can be used. As the raw material of compositional formula (4), for example, $Eu_2O_3$, $Eu_2(CO_3)_3$, $Eu(OH)_3$, $EuCl_3$, MnO, $Mn(OH)_2$, $MnCO_3$, $MnCl_2.4H_2O$, or $Mn(NO_3)_2.6H_2O$ can be used.

As for the raw material of compositional formula (1), $M'^1$ preferably contains at least Si. Also, Si may be partially replaced by at least one element selected from the group consisting of Ge, Ti, Zr and Sn. In this case, a compound where the ratio of Si in $M'^1$ is 80 mol % or more is preferred. As for the raw material of compositional formula (2), $M'^2$ preferably contains at least Ca. Also, Ca may be partially replaced by at least one element selected from the group consisting of Mg, Ba and Zn. In this case, a compound where the ratio of Ca in $M'^2$ is 60 mol % or more is preferred. As for the raw material of compositional formula (3), $M'^3$ preferably contains at least Sr. Also, Sr may be partially replaced by at least one element selected from the group consisting of Mg, Ba and Zn. In this case, a compound where Sr accounts for 30 mol % or more is preferred. As for the raw material of compositional formula (3), X preferably contains at least Cl. Also, Cl may be partially replaced by another halogen element. In this case, a compound where the ratio of Cl is 50 mol % or more is preferred. As for the raw material of compositional formula (4), $M'^4$ is preferably a rare earth element containing divalent Eu and may contain, for example, Mn or a rare earth element other than Eu.

The raw materials of compositional formulae (1) to (4) are weighed in a ratio to give molar ratios of (1):(2)=1: from 0.1 to 1.0, (2):(3)=1: from 0.2 to 12.0 and (2):(4)=1: from 0.05 to 4.0, preferably (1):(2)=1: from 0.25 to 1.0, (2):(3)=1: from 0.3 to 6.0 and (2):(4)=1: from 0.05 to 3.0, more preferably (1):(2)=1: from 0.25 to 1.0, (2):(3)=1: from 0.3 to 4.0 and (2):(4)=1: from 0.05 to 3.0, and respective raw materials weighed are put in an alumina mortar and ground/mixed for about 30 minutes to obtain a raw material mixture. This raw material mixture is put in an alumina crucible and fired in an electric furnace having a reducing atmosphere at a temperature of 700° C. to less than 1,100° C. for 3 to 40 hours in a predetermined atmosphere ($H_2:N_2$=5:95) to obtain a fired material. The fired material is deliberately washed with warm pure water to rinse excess chloride off, whereby the first phosphor can be obtained. The first phosphor is excited by an ultraviolet ray or short-wavelength visible light and emits visible light.

Incidentally, with respect to the raw material (divalent metal halide) of compositional formula (3), an amount in excess of the stoichiometric ratio is preferably weighed so as to prevent the phosphor from generation of a crystal defect due to lack of a halogen element, because the halogen atom is partially vaporized/evaporated during firing. In addition, the raw material of compositional formula (3) added in excess is liquefied at the firing temperature and acts as a flux of a solid-phase reaction to thereby accelerate the solid-phase reaction and enhance the crystallinity.

Incidentally, after the firing of the raw material mixture, the raw material of compositional formula (3) added in excess is present as an impurity in the produced phosphor. Therefore, such an impurity is preferably washed out with warm pure water so as to obtain a phosphor having high purity and high emission intensity. The compositional ratio represented by the formula of the first phosphor of this embodiment is a compositional ratio after washing out of the impurity, and the raw material of compositional formula (3) that was added in excess and became an impurity is not taken account of in the compositional formula.

[Second Phosphor]

The second phosphor is a phosphor having an emission color in complementary relationship with the emission color of the first phosphor and having a peak wavelength at 430 to 480 nm. Such a second phosphor efficiently absorbs near infrared or short-wavelength visible light and radiates light with a dominant wavelength of 440 to 470 nm. The phosphor which can be used as the second phosphor is not particularly limited in its composition but can be selected, for example, from phosphors (1) to (4) represented by the following formulae:

(1) a phosphor represented by the formula: $M^1{}_a(M^2O_4)_b X_c:Re_d$ (wherein $M^1$ represents one or more elements containing at least any of Ca, Sr and Ba and being selected from the group consisting of Ca, Sr, Ba, Mg, Zn, Cd, K, Ag and Tl, $M^2$ represents one or more elements containing at least P and being selected from the group consisting of P, V, Si, As, Mn, Co, Cr, Mo, W and B, X represents at least one halogen element, Re represents one or more elements containing at least $Eu^{2+}$ and being selected from the group consisting of a rare earth element and Mn, a is in a range of $4.2 \leq a \leq 5.8$, b is in a range of $2.5 \leq b \leq 3.5$, c is in a range of $0.8 \leq c \leq 1.4$, and d is in a range of $0.01 < d < 0.1$);

(2) a phosphor represented by the formula: $M^1{}_{1-a} MgAl_{10}O_{17}:Eu^{2+}{}_a$ (wherein $M^1$ represents at least one or more elements selected from the group consisting of Ca, Sr, Ba and Zn, and a is in a range of $0.001 \leq a \leq 0.5$);

(3) a phosphor represented by the formula: $M^1{}_{1-a}MgSi_2O_8:Eu^{2+}{}_a$ (wherein $M^1$ represents at least one or more elements selected from the group consisting of Ca, Sr, Ba and Zn, and a is in a range of $0.001 \leq a \leq 0.8$); and (4) a phosphor represented by the formula: $M^1{}_{2-a}(B_5O_9) X:Re_a$ (wherein $M^1$ represents at least one or more elements selected from the group consisting of Ca, Sr, Ba and Zn, X represents at least one halogen element, and a is in a range of $0.001 \leq a \leq 0.5$).

$(Ca,Mg)_5(PO_4)_3Cl:Eu^{2+}$ that is one example of the second phosphor can be obtained, for example, as follows. As for the second phosphor, $CaCO_3$, $MgCO_3$, $CaCl_2$, $CaHPO_4$ and $Eu_2O_3$ are used as raw materials, and these raw materials are weighed in a predetermined ratio to yield a molar ratio of $CaCO_3:MgCO_3:CaCl_2:CaHPO_4:Eu_2O_3$=from 0.05 to 0.35: from 0.01 to 0.50: from 0.17 to 2.50:1.00: from 0.005 to 0.050. Respective raw materials weighed are put in an alumina mortar and ground/mixed for about 30 minutes to obtain a raw material mixture, and this raw material mixture is put in an alumina crucible and fired at a temperature of 800° C. to less than 1,200° C. for 3 hours in an $N_2$ atmosphere containing from 2 to 5% of $H_2$ to obtain a fired material. The fired material is deliberately washed with warm pure water to rinse excess chloride off, whereby the second phosphor can be obtained. The second phosphor emits visible light of color in complementary relationship with the visible light emitted from the first phosphor.

Incidentally, as for the amount (molar ratio) of $CaCl_2$ weighed when obtaining the raw material mixture above, an amount in excess of the stoichiometric ratio by 0.5 mol or more based on the compositional ratio of the second phosphor produced is preferably weighed. By such weighing, the second phosphor can be prevented from generation of a crystal defect due to lack of Cl.

Specific examples of the first and second phosphors are disclosed in Japanese Patent Application Nos. 2010-046130 and 2010-113139 filed by the same applicant. The disclosures of these applications are herein incorporated by reference.

As described in the foregoing pages, in the planar light-emitting module according to this embodiment, an air layer is allowed to intervene between first and second transparent resin layers, whereby light radiated from the light-emitting element can be diffused in a wide range and a planar light-emitting module reduced in illuminance unevenness can be realized. Also, two transparent resin layers each having dispersed therein a phosphor are provided, whereby pseudo-white light illumination with little color unevenness can be achieved.

The present invention is not limited to the above-described embodiments, and various modifications such as design change can be made therein based on the knowledge of one skilled in the art. The configurations shown in respective Figures are to explain one example, and as long as it is a configuration capable of achieving the same function, appropriate changes can be made therein and the same effects can be obtained.

For example, the first transparent resin layer 24 and the second transparent resin layer 26, materials having various physical properties, other than a phosphor, can be mixed. When a material having a higher refractive index than the binder member, such as metal oxide, fluorine compound and sulfide, is mixed in the transparent resin layers 24 and 26, the refractive index of the transparent resin layers 24 and 26 can be increased, and this produces an effect of reducing total reflection occurring when light generated from the light-emitting element 18 enters the transparent resin layers 24 and 26, and improving the introduction efficiency of excitation light into the transparent resin layers 24 and 26. Furthermore, when the material mixed is adjusted to have a nanosize particle diameter, the refractive index of the transparent resin layers 24 and 26 can be increased without reducing the transparency. Also, a white powder having an average particle diameter of approximately from 0.3 to 3 μm, such as alumina, zirconia and titanium oxide, can be mixed as a light scattering agent in the transparent resin layers 24 and 26. By this mixing, unevenness of luminance and chromaticity in the light-emitting face can be prevented. The transparent resin layers 24 and 26 are a light-transmitting layer covering the light-emitting element 18 and functions as a light-transmitting member in which the later-described first phosphor or second phosphor is dispersed. In addition, $SiO_2$ with a size of several nm to hundreds of nm may be mixed. By mixing such a transparent fine particle, the thixotropy of the phosphor paste is increased and it becomes possible to maintain the shape of the coated phosphor paste or prevent precipitation of the phosphor in the cured layer.

Figure 4B:
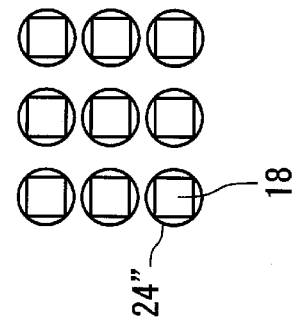
FIGS. 4A and 4B are views of modified example of a first transparent resin layer which encapsulates the light-emitting element.
Figure 4A:
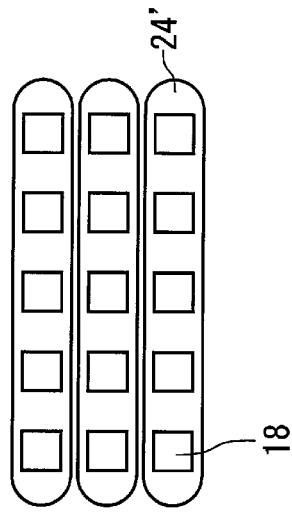

In the mode of practice, the entirety of the substrate 12 is encapsulated in the first transparent resin layer with a uniform thickness, but the portions other than the light-emitting element on the substrate 12 need not be encapsulated. For example, as shown in FIG. 4A, the light-emitting element 18 on the substrate may be encapsulated on a line-by-line basis in the first transparent resin layer 24', or as shown in FIG. 4B, the light-emitting element 18 on the substrate can be encapsulated one by one in the first transparent resin layer 24". In either case, the distance from the light exit face of each light-emitting element 18 to the surface of the first transparent resin layer is preferably at the same level as the distance L described in the mode of practice so that illumination reduced in illuminance unevenness can be obtained over a wide range.

What is claimed is:

1. A planar light-emitting module comprising:
    a planar substrate applied with a reflection film;
    a light-emitting element mounted on the reflection film side of the substrate;
    a first transparent resin layer disposed to encapsulate at least the light-emitting element; and
    a second transparent resin layer, an air layer being sandwiched between the second transparent resin layer and the first transparent resin layer,
    wherein a phosphor for converting the wavelength of light radiated from the light-emitting element is disposed by dispersion in the first and second transparent resin layers and the phosphor is selected such that when the second transparent resin layer is viewed from the outside, pseudo-white light is observed;
    the light emitting element radiates ultraviolet light or short-wavelength visible light, and
    the phosphor of the first transparent layer and the phosphor of the second transparent layer each includes a first phosphor for converting light radiated from the light-emitting element into yellow light and a second phosphor for converting light radiated from the light-emitting element into blue light.

2. The planar light-emitting module as claimed in claim 1, wherein thicknesses of the first and second transparent resin layers, a thickness of the air layer disposed between the first transparent resin layer and the second transparent layer, and a concentration of the phosphor are set such that when the second transparent resin layer is viewed from the outside, pseudo-white light with substantially uniform luminance is observed.

3. The planar light-emitting module as claimed in claim 1, further comprising:
    a cover transparent or semi-transparent to visible light, wherein the second transparent resin layer is provided on the substrate-side surface of the cover.

4. The planar light-emitting module as claimed in claim 2, wherein
    the light-emitting element radiates ultraviolet light or short-wavelength visible light, and
    the phosphor includes a first phosphor for converting light radiated from the light-emitting element into yellow light and a second phosphor for converting light radiated from the light-emitting element into blue light.

5. The planar light-emitting module as claimed in claim 2, further comprising:
    a cover transparent or semi-transparent to visible light, wherein the second transparent resin layer is provided on the substrate-side surface of the cover.

6. The planar light-emitting module as claimed in claim 1, further comprising:
    a cover transparent or semi-transparent to visible light, wherein the second transparent resin layer is provided on the substrate-side surface of the cover.

7. The planar light-emitting module as claimed in claim 4, further comprising:
    a cover transparent or semi-transparent to visible light, wherein the second transparent resin layer is provided on the substrate-side surface of the cover.

8. The planar light-emitting module as claimed in claim 1, wherein a thicknesses of the first transparent resin layer is greater than a thickness of the second transparent resin layer.

9. The planar light-emitting module as claimed in claim 8, further comprising:
    a cover transparent or semi-transparent to visible light, wherein the second transparent resin layer is provided on the substrate-side surface of the cover.

* * * * *